United States Patent
Lai et al.

(10) Patent No.: US 6,764,369 B2
(45) Date of Patent: Jul. 20, 2004

(54) MASS PRODUCTION ENCAPSULATION EQUIPMENT AND METHOD FOR ORGANIC LIGHT EMITTING DISPLAY DEVICES

(75) Inventors: Yuang-Wei Lai, Hsinchu (TW); Jih-Yi Wang, Hsinchu (TW); Mao-Kuo Wei, Hsinchu (JP)

(73) Assignee: RiTdisplay Corporation, Hsinchu (TW)

( * ) Notice: Subject to any disclaimer, the term of this patent is extended or adjusted under 35 U.S.C. 154(b) by 33 days.

(21) Appl. No.: 10/064,524

(22) Filed: Jul. 24, 2002

(65) Prior Publication Data
US 2003/0077971 A1 Apr. 24, 2003

(30) Foreign Application Priority Data
Oct. 19, 2001 (TW) ........................................ 90125885 A

(51) Int. Cl.[7] .............. H01J 9/46; H01J 9/26; B05C 13/00
(52) U.S. Cl. .............. 445/66; 445/25; 445/60; 445/65; 118/66; 118/712; 156/379.8
(58) Field of Search .............. 445/24, 25, 60, 445/65, 66; 118/671, 697, 712, 642, 643, 66, 64, 300, 324, 400; 156/272.4, 275.5, 275.7, 379.6, 379.8, 380.8

(56) References Cited

U.S. PATENT DOCUMENTS

| | | | |
|---|---|---|---|
| 5,926,828 A | 7/1999 | Khandekar | |
| 6,113,694 A | * 9/2000 | Davis | ........................ 118/663 |
| 6,243,768 B1 | 6/2001 | Khandekar | |
| 6,350,316 B1 | * 2/2002 | Hayashi et al. | ............... 118/52 |
| 6,372,042 B1 | * 4/2002 | Sung et al. | .................... 118/52 |

OTHER PUBLICATIONS

U.S. patent application 10/058,838 entitled "Apparatus and Method to track Command Signal Occurrence for DRAM Data Transfer" Filed Jan. 28, 2002.

* cited by examiner

*Primary Examiner*—Kenneth J. Ramsey
*Assistant Examiner*—German Colón
(74) *Attorney, Agent, or Firm*—Jianq Chyun IP Office

(57) ABSTRACT

Mass production encapsulation equipment and method for mass production of organic light emitting display devices, having a transporting system, a panel supply system, multiple dispensing systems, turning/storage system, cover plate supply system, lamination/ultra-violet radiation system, and an ultra-violet radiation system. The above systems are linked via the transmission system. Being supplied by the panel supply system, a panel is transported to the turning/storage system for turning over. The panel is then transported into alternate dispensing systems for resin coating. The panel coated with resin is again transported to the turning/storage system for storage. The first exposure stage is performed by an aligning lamination performed on the panel and a cover plate supplied by the cover plate supply system in the lamination/ultra-violet radiation system. The second exposure stage is further performed to cure the resin in the ultra-violet radiation system.

31 Claims, 8 Drawing Sheets

MASS PRODUCTION ENCAPSULATION EQUIPMENT AND METHOD FOR ORGANIC LIGHT EMITTING DISPLAY DEVICES

CROSS REFERENCE TO RELATED APPLICATIONS

This application claims the priority benefit of Taiwan application serial no. 90125885, filed on Oct. 19, 2001.

BACKGROUND OF THE INVENTION

1. Field of the Invention

The invention relates in general to a mass production encapsulation method, and more particularly, to a mass production encapsulation equipment and method for organic light emitting display devices.

2. Description of the Related Art

After the American company Kodak disclosed the organic light emitting device (Appl. Phys. Lett., Vol. 15, p.914 (1987)), University of Cambridge in England successfully applied polymer materials to light emitting devices in 1990 (Nature, Vol. 347, p.539 (1990)). The foundation for practical application of light emitting devices was thus established. This has attracted great attention from industrial, academic and official institutions in various countries, and subsequent research and development has commenced.

Having the features of self-luminescence, wide view angles (160°), high response speed, low driving voltage and full color, the light emitting devices are the flat panel display technique for the next century. Currently, the organic light emitting device has been developed practically to the application stage, and is believed to be the color flat panel for the next generation. The high-level product applications of such flat panel light emitting devices includes full color flat panel display devices, such as small display panels, outdoor display panels, computer and television screens. As the technique has only lately been developed, only the Japanese company Pioneer has a smaller product on the current market. It indicates that some problems have to be overcome for commercializing the light emitting display, especially for mass production.

The current development of the technique related to the organic light emitting devices is focused on the device and material structure. Development of the encapsulation process technique, especially the process using a cover plate to encapsulating the light emitting display panel, can hardly be found, not even to mention mass production thereof. Prior art that has discussed the encapsulation technique of organic light emitting devices is found as follows.

1. In U.S. Pat. No. 5,882,761 filed by Pioneer, an encapsulation method for an organic light emitting device is disclosed. A moisture absorbing material is applied in this encapsulation method. However, nothing related to mass production has been suggested.

2. U.S. Pat. No. 6,049,167 filed by TDK also disclosed a packaging method of an organic light emitting device. The moisture material is not included, however, and the equipment of the packaging process disclosed in this patent is applicable for batch equipment only. It is suitable for lab operation, but is not suitable for mass process.

3. The encapsulation method disclosed in U.S. Pat. No. 5,958,778 filed by IBM includes using multiple protection films and glass or metal for device packaging. It is very difficult to mass produce the multiple films, so that the method provided by IBM is again not suitable for mass production.

4. In U.S. Pat. No. 5,962,962 filed by Idemitsu, the encapsulation method of organic light emitting device uses inert liquid to fabricate the device. Further, moisture absorption material is added in the inert liquid. However, all the materials have to be dehydrated to obtain a proper effect, so that the technique disclosed by Idemitsu is not suitable for mass production.

U.S. Pat. No. 5,990,615, improved on the encapsulation method for organic light emitting devices disclosed by Pioneer and Idemitsu by electroplating a protection layer. However, the disadvantage of the methods disclosed by Pioneer and Idemitsu still exists.

According to the above, the conventional encapsulation method does not suggest a method for mass production, or the technique of the conventional packaging method cannot achieve mass production.

SUMMARY OF THE INVENTION

The present invention provides mass production encapsulation equipment and method. The encapsulation equipment comprises a transporting system, a panel supply system, multiple dispensing systems, a turning/storage system, a cover plate supply system, a lamination/ultra-violet radiation system and an ultra-violet radiation system. The above systems are linked by the transporting system. A panel supplied from the panel supply system is transported into the turning/storage system to make a 180° turn. The flipped panel is transported into each dispensing system alternately for resin coating thereon. The panel that has been coated with resin through each dispensing system is then transported into the turning/storage system again. The turning/storage system can store at least one panel to provide the buffer function for mass production equipment. Therefore, process waiting for problems caused by inconsistent process speeds for various stages can be resolved. The panel is transported from the turning/storage system to the lamination/ultra-violet radiation system, and the first stage exposure is performed while the panel is aligning laminated with a cover plate supplied by the cover plate supply system. The cover plate can optionally be also coated with the resin. The second stage exposure is then performed on the panel in the ultra-violet radiation system.

The present invention applies multiple dispensing systems to coat resin simultaneously, so that the dispensing speed is enhanced. The distance between the dispensing syringe and the panel is measured by laser. Therefore, the distance between the dispensing syringe and the coating object can be precisely controlled.

Further, the resin quantity to be coated can also kept constant.

By performing two-stage exposure, the problems of overheating the ultra-violet light exposure equipment and extending exposure time can be resolved, and the yield for ultra-violet exposure is increased.

In addition, in the above mass production encapsulation equipment and method of the light emitting display device, the allocation of the panel supply system and the cover plate supply system can be exchanged to coat resin on the cover plate for mass production encapsulation.

Both the foregoing general description and the following detailed description are exemplary and explanatory only and are not restrictive of the invention, as claimed.

DETAILED DESCRIPTION

An organic light emitting display panel and a cover plate are provided. The material of the organic light emitting display panel and the cover plate include glass, plastic, acrylic, polymer or metal. The dimension of the panel and the cover plate is about 400 mm×400 mm, 370 mm×470 mm, or 200 mm×200 mm with a thickness of about 1.1 mm, 0.7 mm, or 0.55 mm.

Figure 1:
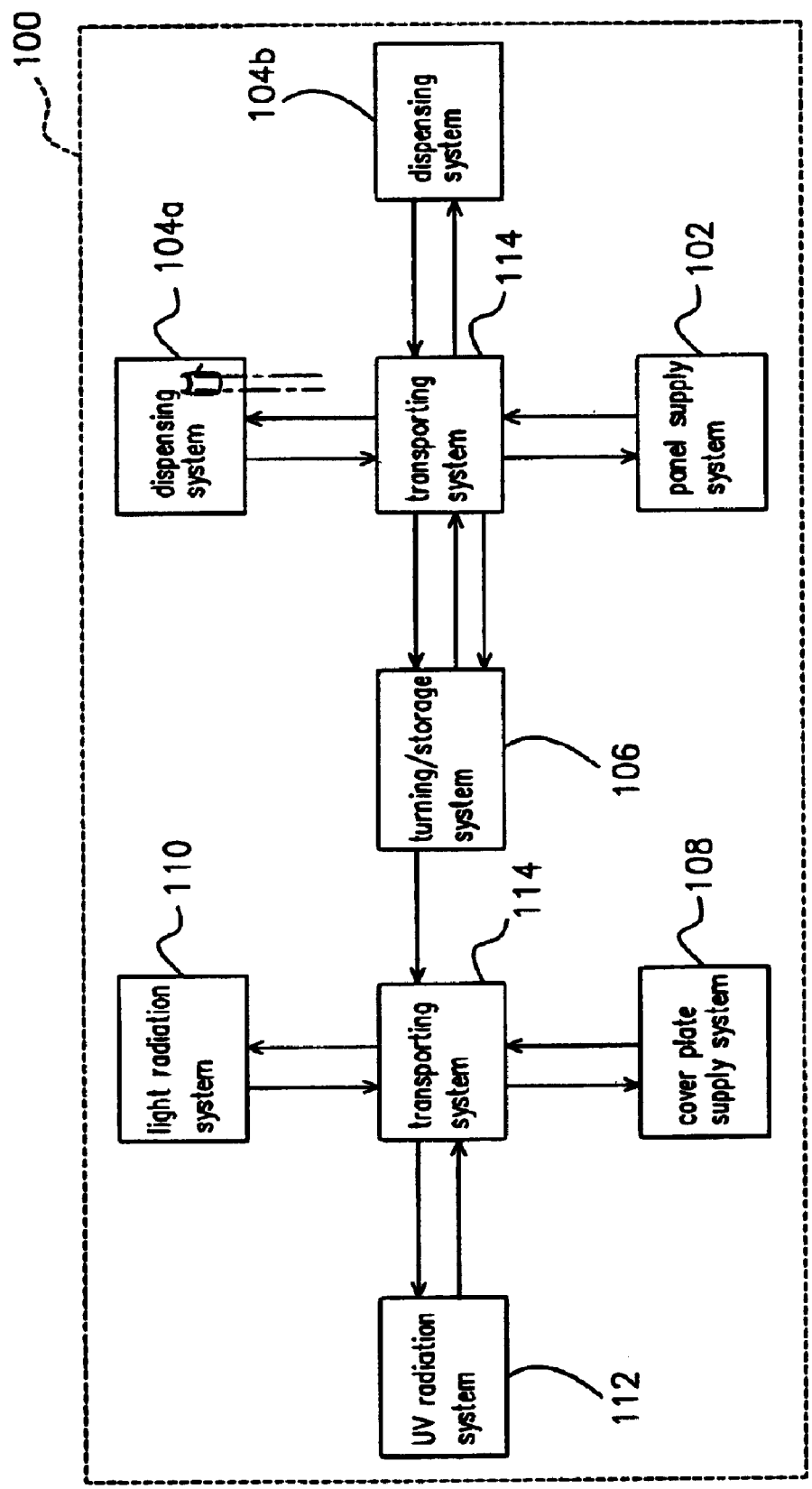
FIG. 1 is a schematic drawing of a mass production encapsulation equipment for organic light emitting display devices in the first embodiment of the invention.

Referring to FIG. 1, the first embodiment of a mass production encapsulation equipment for organic light emitting display devices is shown. The mass production encapsulation equipment for organic light emitting display devices includes an atmosphere control system 100. The atmosphere control system 100 comprises a panel supply system 102, at least one dispensing system 104a and 104b, a turning/storage system 106, a cover plate supply system 108, a lamination/ultraviolet (UV) light radiation system 110, an ultra-violet radiation system 112, and a transporting system 114. The atmosphere control system 100 controls the whole system to operate in a nitrogen or other inert gas environment. A gas circulating and purifying system is incorporated to keep moisture level under 100 ppm and the oxygen level under 500 ppm. Preferably, the moisture and oxygen levels are kept under 10 ppm. The transportation for the panels and the cover plate between the above systems is performed by the transporting system 114, such as a conveyance belt or a mechanical arm.

Referring to FIG. 1, an organic light emitting display panel is delivered into the atmosphere control system 100 from the panel supply system 102. The panel is turned 180° in the turning/storage system 106. The turned panel is then coated with resin in at least two sets of dispensing systems 104a and 104b. The dispensing systems 104a and 104b comprise at least one syringe, preferably comprise multiple syringes, for example, four or eight syringes to coat resin on a surface of the panel. The resin includes an ultra-violet cure resin. The syringes are controlled by a program to automatically position along X, Y and Z directions for coating resin in different patterns. By adjusting the working distance with the laser measurement, the advantage of maintaining a constant amount of resin is obtained. The ultra-violet cure resin can be coated on the panel but also can be optionally coated on the cover plate.

The panel through the dispensing systems 104a and 104b is then turned and stored in the turning/storage system 106. The turning/storage system 106 not only turns the panel using a mechanical arm (without manual operation) before it enters the dispensing systems 104a and 104b, but also stores panels which have been coated by the dispensing systems 104a and 104b. The process waiting problems caused by inconsistent processing speed can thus be resolved by the buffer function provided thereby.

Further referring to FIG. 1, the panel is transported into the lamination/ultra-violet radiation system 110 to be aligned with the cover plate. A pressure is then applied to perform lamination.

Figure 2A:
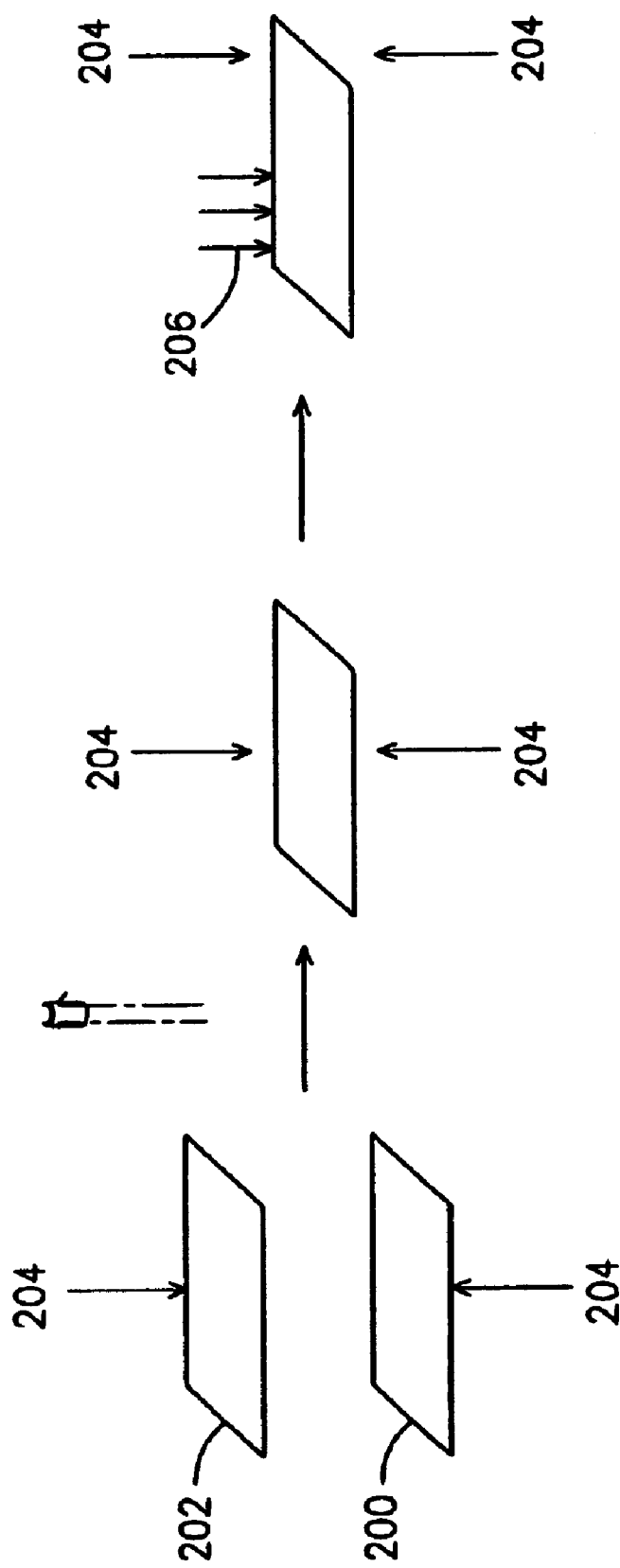
FIG. 2A and FIG. 2B shows two methods to perform lamination in the lamination/ultra-violet radiation system in the first embodiment of the invention.
Figure 2B:
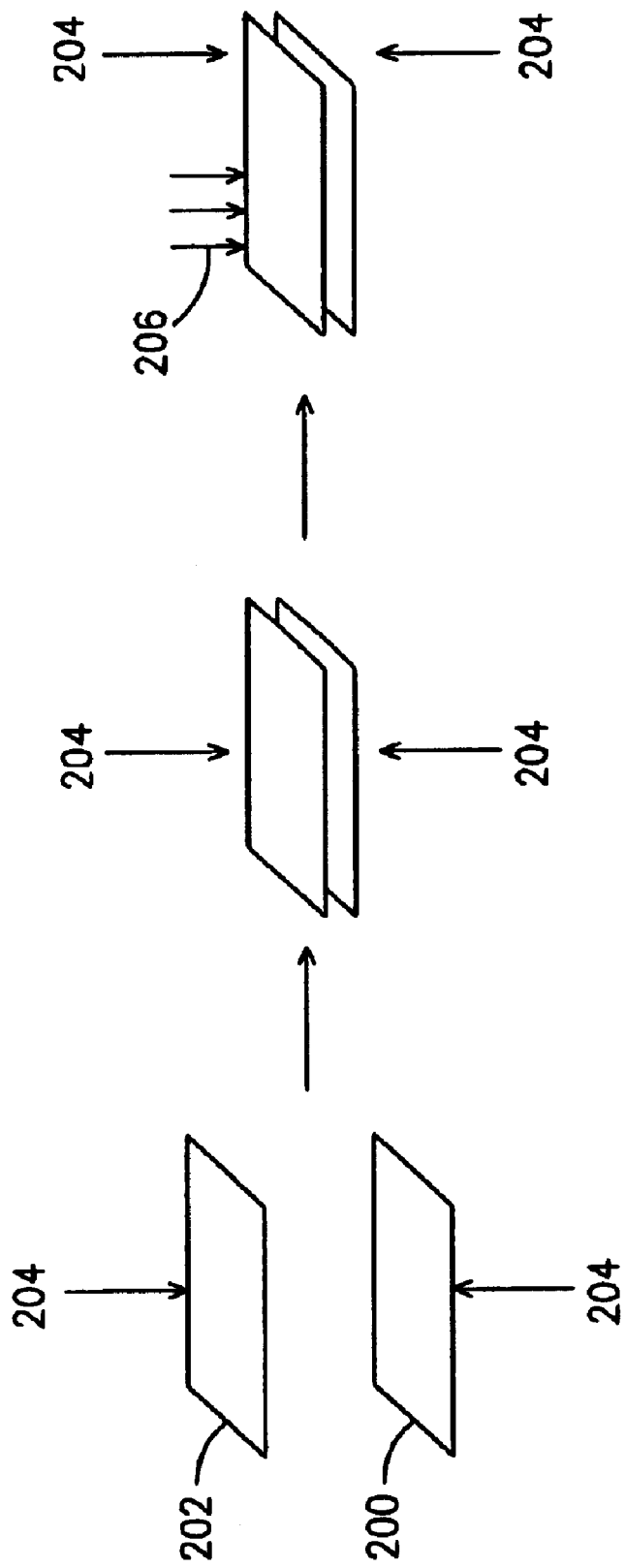

Referring to FIGS. 2A and 2B, a pressure 204 is provided to laminate the panel 200 and the cover plate 202. The space between the panel 200 and the cover plate 202 is not controlled, or controlled by adding a spacer. Another method to control the space between the panel 200 and the cover plate 202 includes mechanical positioning control. A pressure 204 provided for lamination remains unchanged when the panel 200 and the cover plate 202 are positioned. The aligning method for lamination includes a mechanical positioning method or optical charge-coupled device. The pressure source includes a mechanical pressure source, gas pressure source or hydraulic pressure source. In addition, an ultra-violet light 206 is radiating while the lamination process is performed. The first stage exposure is thus performed on the resin between the panel 200 and the cover plate 202.

After the lamination is stable, the transporting system 110 transports the panel to the ultra-violet radiation system 112 for the second stage exposure. Meanwhile, the ultra-violet radiation system 112 provides an ultra-violet light for curing the resin. The transporting system 114 then delivers the encapsulated panel of the organic light emitting display into a product removal system for subsequent cutting and testing.

In this embodiment, the positions of the organic emitting display panel and the cover plate can be exchanged. That is, the positions of the panel supply system 102 and the cover plate supply system 108 are exchangeable. To save the space, the panel supply system 102 and the cover plate supply system 108 can also be used as a product removal system for removing the encapsulated products.

Figure 3:
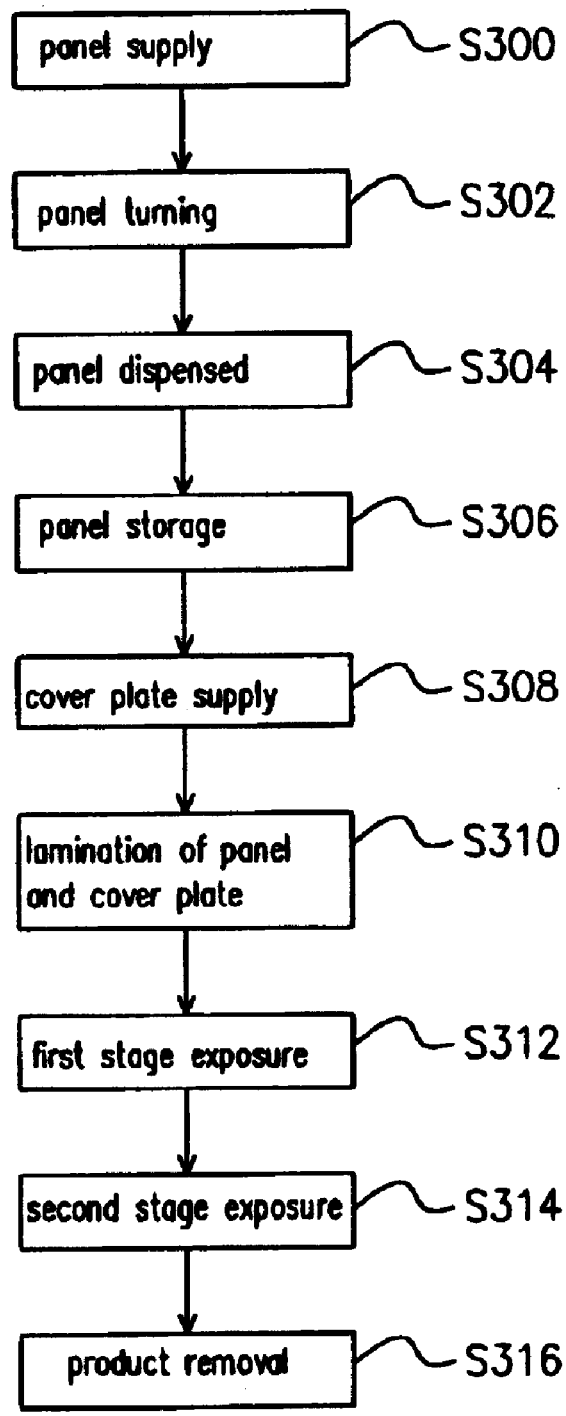
FIG. 3 shows the process flow of mass production encapsulation for organic light emitting devices in the first embodiment of the invention.

Referring to FIG. 3, a process flow for the mass production of encapsulation for organic light emitting display devices is shown. The process flow includes the steps of panel supply S300, panel turning S302, panel dispensed S304, panel storage S306, cover plate supply S308, lamination of panel and cover plate S310, first stage exposure S312, second stage exposure S314 and product removal S316. By using multiple dispensing systems to perform dispensing resin, the buffer function of turning/storage system, and two stages of exposure, automatic mass production is obtainable.

An organic light emitting display panel and a cover plate are provided. The material of the organic light emitting display panel and the cover plate include glass, plastic, acrylic, polymer or metal. The dimension of the panel and the cover plate is about 400 mm×400 mm, 370 mm×470 mm, or 200 mm×200 mm with a thickness of about 1.1 mm, 0.7 mm, or 0.55 mm.

Figure 4:
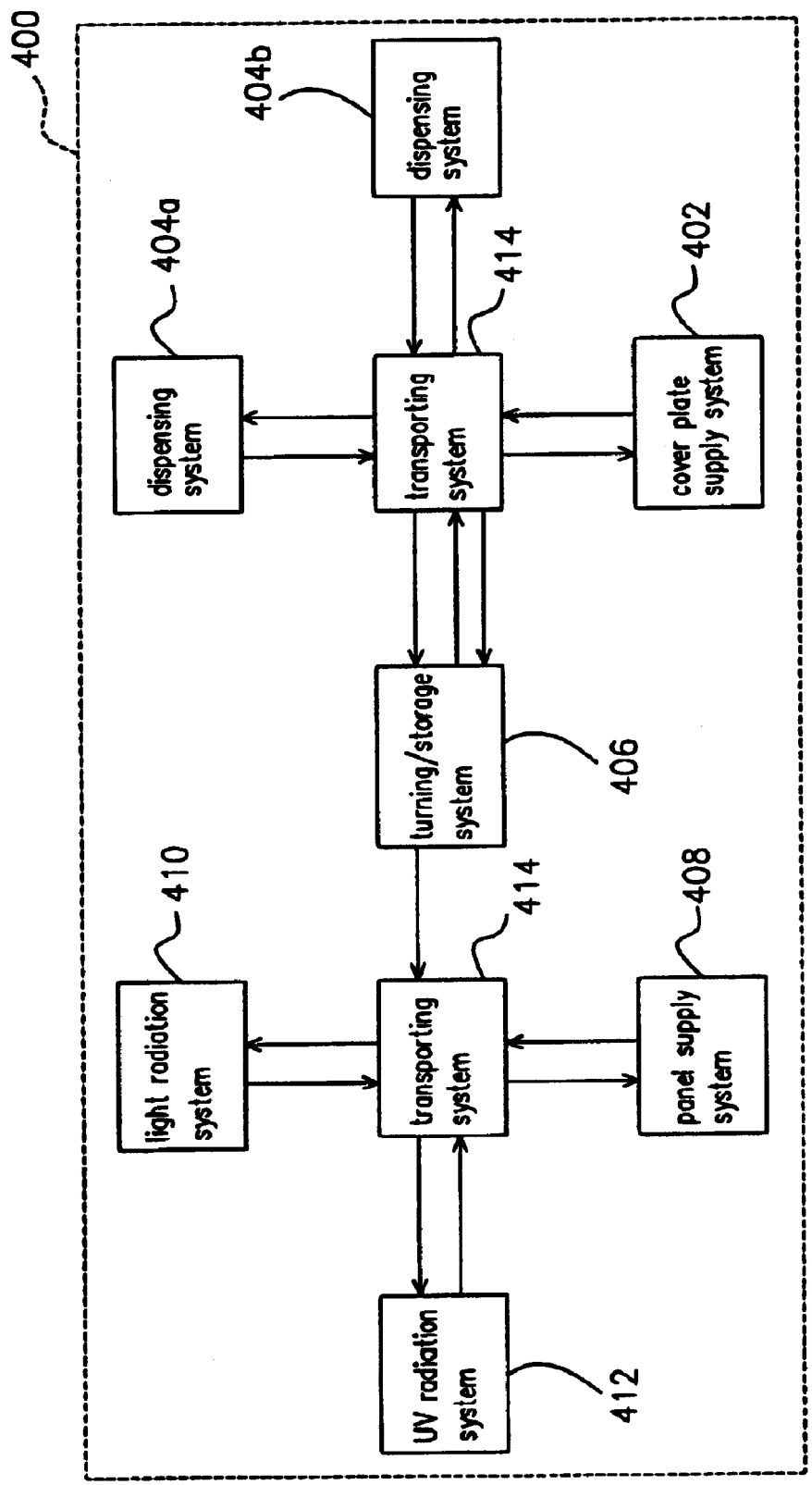
FIG. 4 is a schematic drawing of a mass production encapsulation equipment for organic light emitting display devices in the second embodiment of the invention.

Referring to FIG. 4, the second embodiment of a mass production of encapsulation equipment for organic light emitting display devices is shown. The mass production of encapsulation equipment for organic light emitting display includes an atmosphere control system 400. The atmosphere control system 400 comprises a cover plate supply system 402, at least one dispensing system 404a and 404b, a turning/storage system 406, a panel supply system 408, a lamination/ultra-violet (UV) light radiation system 410, an ultra-violet radiation system 412, and a transporting system 414. The atmosphere control system 400 controls the whole system to operate in a nitrogen or other inert gas environment. A gas circulating and purifying system is incorporated to keep the moisture level under 100 ppm and the oxygen level under 500 ppm. Preferably, the moisture and oxygen levels are kept under 10 ppm. The transportation for the panels and the cover plate between the above systems is performed by the transporting system 414, such as a conveyance belt or a mechanical arm.

Referring to FIG. 4, a cover plate is delivered into the atmosphere control system 400 from the cover plate supply system 402. The cover plate is alternately disposed in the dispensing system 404a and 404b, so that at least two cover plates can be coated at the same time. The dispensing systems 404a and 404b include the dispensing system having image distinguishing property to dispense resin on the cover plate. The resin includes an ultra-violet curing resin. The dispensing systems 404a and 404b comprise multiple syringes controlled by a program to automatically position along X, Y and Z directions for coating resin in different patterns. By adjusting the working distance between the laser measurements, the advantage of maintaining a constant amount of resin is obtained.

The cover plate coated with resin by the dispensing systems 404a and 404b is then turned and stored in the turning/storage system 406. The turning/storage system 406 can store at least one cover plate coated with resin at the same time. The process waiting problems caused by inconsistent processing speed can thus be resolved by the buffer function provided thereby.

Further referring to FIG. 4, the cover plate is transported into the lamination/ultra-violet radiation system 410 to aligned with the panel with is also transported therein from the panel supply system 408. A pressure is then applied to perform lamination.

Figure 5A:
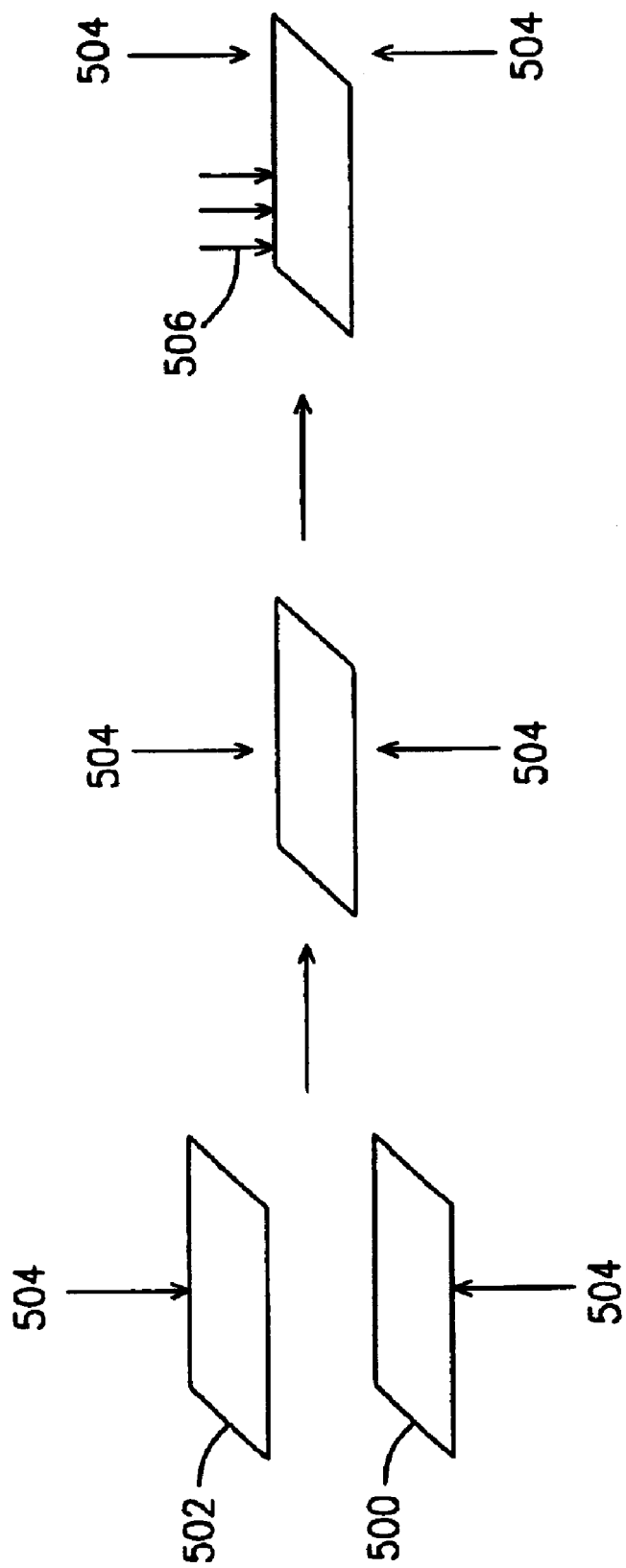
FIG. 5A and FIG. 5B shows two methods to perform lamination in the lamination/ultra-violet radiation system in the second embodiment of the invention.
Figure 5B:
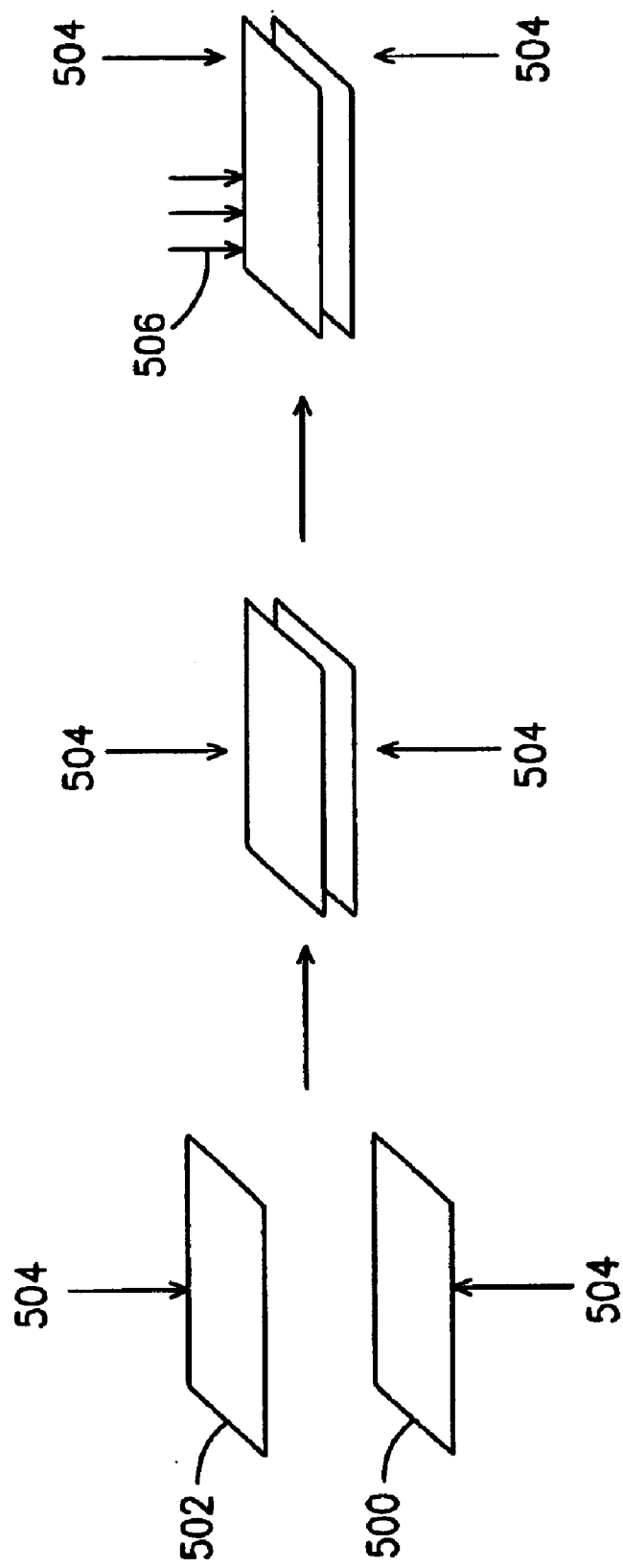

Referring to FIGS. 5A and 5B, a pressure 504 is applied to directly laminate the panel 500 and the cover plate 502. The space between the panel 500 and the cover plate 502 is not controlled, or controlled by adding a spacer. Another method to control the space between the panel 500 and the cover plate 502 includes mechanical positioning control. A pressure 504 provided for lamination remains unchanged when the panel 500 and the cover plate 502 are positioned and the space remains the same. The aligning method for lamination includes a mechanical positioning method or optical charge-coupled device. The pressure source includes mechanical pressure source, gas pressure source or hydraulic pressure source. In addition, an ultra-violet light 506 is radiating while the lamination process is performed. The first stage exposure is thus performed on the resin between the panel 500 and the cover plate 502. After the lamination is stable, the transporting system 510 transports the panel to the ultra-violet radiation system 512 for the second stage exposure. Meanwhile, the ultra-violet radiation system 512 provides an ultra-violet light for curing the resin. The transporting system 514 then delivers the encapsulation of the organic light emitting display panel into a product removal system for subsequent cutting and testing.

In this embodiment, the positions of the organic emitting display panel and the cover plate can be exchanged. That is, the positions of the cover plate system 402 the panel supply system 408 are exchangeable. To save space, the cover plate supply system 402 and the panel supply system 408 can also be used as the product removal system for removing the encapsulated products.

Figure 6:
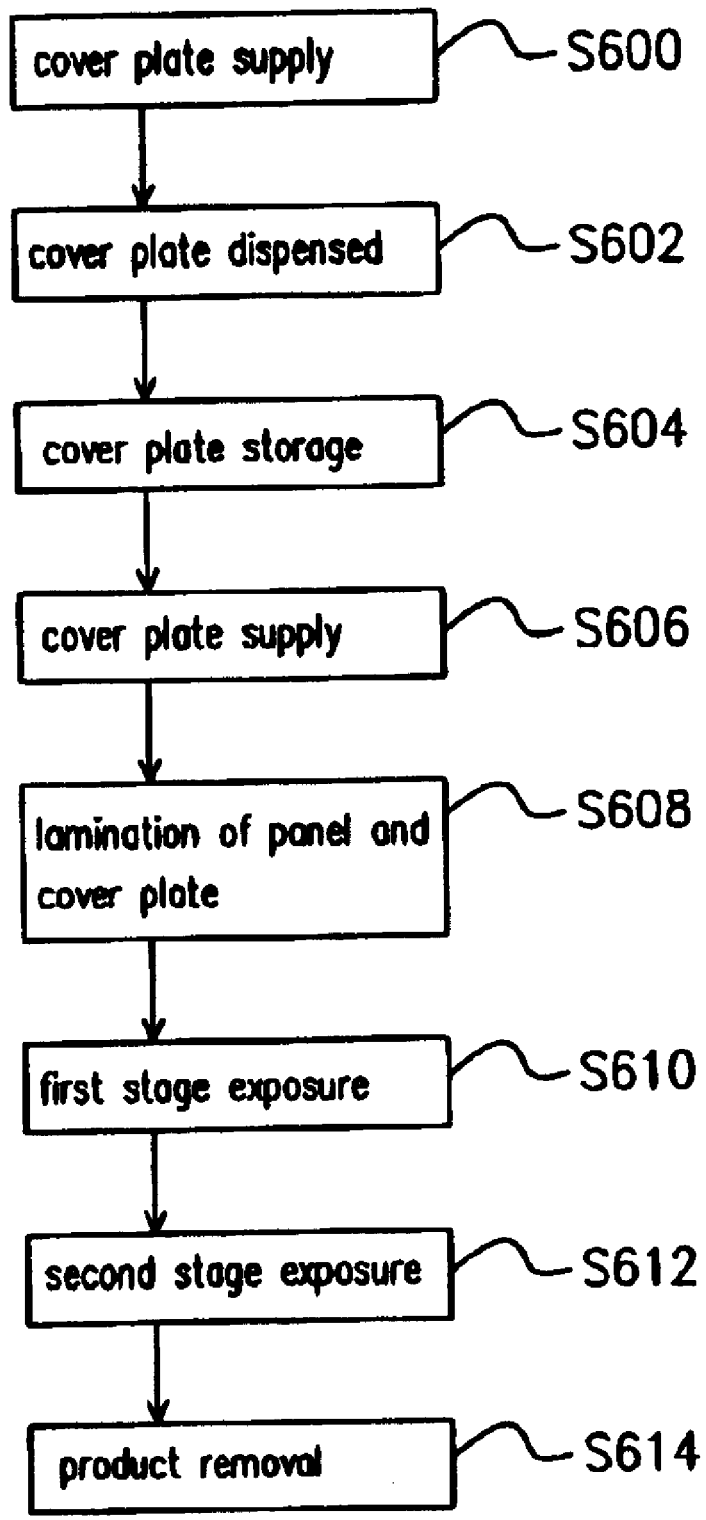
FIG. 6 shows the process flow of mass production encapsulation for organic light emitting devices in the second embodiment of the invention.

Referring to FIG. 6, a process flow for the mass production of encapsulation for organic light emitting display devices is shown. The process flow includes the steps of cover plate supply S600, cover plate dispensed S602, cover plate storage S604, panel supply S606, lamination of panel and cover plate S608, first stage exposure S610, second stage exposure S612 and product removal S614. By using multiple dispensing systems to perform dispensing resin, the buffer function of turning/storage system, and two stages of exposure, the automatic mass production is obtainable.

According to the above, the invention has at least the following advantages:

1. Two sets of dispensing systems are used to enhance the dispensing speed. When one set of the dispensing systems is under maintenance, the other set of the dispensing systems can provide normal operation without affecting mass production.
2. A laser is used to precisely measure the distance between the syringe and the panel or cover plate to accurately control the stability of resin.
3. The module design improves the convenience for maintenance and reduces the maintenance time.
4. Two stages of exposure are performed for curing the resin, so the heat for exposure is effectively dissipated and the exposure yield is increased.
5. The turning/storage system provides the buffer function to resolve the process waiting problems caused by inconsistent operation processes.
6. The syringe is automatically positioned by the X, Y and Z program, so that it is suitable for coating resin in various patterns.

Other embodiments of the invention will appear to those skilled in the art from consideration of the specification and practice of the invention disclosed herein. It is understood that the specification and examples are to be considered as exemplary only, with a true scope and spirit of the invention being indicated by the following claims.

What is claimed is:

1. A mass production encapsulation equipment for organic light emitting display devices, comprising:

a panel supply system, to supply an organic light emitting display panel to the mass production encapsulation equipment;

at least one dispensing system, to coat a resin on the panel;

a turning/storage system, to turn the panel and to store the panel after it is coated with the resin;

a cover plate supply system, to supply a cover plate to the mass production encapsulation equipment, wherein the cover plate can be optionally coated with the resin;

a lamination/ultra-violet radiation system, to laminate the panel and the cover plate after they are aligned, and having a first ultra-violet radiation system to perform a first stage exposure;

a second ultra-violet radiation system, to perform a second stage exposure to cure the resin;

a transporting system, to transport the panel between the panel supply system, at least one dispensing system, the turning/storage system, the lamination/ultra-violet radiation system, second ultra-violet radiation system, and to transport the cover plate between the cover plate supply system, the lamination/ultra-violet radiation system, second ultra-violet radiation system; and an atmosphere control system, to control moisture level and oxygen level of the mass production encapsulation equipment.

2. The mass production encapsulation equipment according to claim 1, wherein the panel supply system is also used as a product removal system.

3. The mass production encapsulation equipment according to claim 1, wherein the turning/storage system stores at least one panel at a time to allow at least one dispensing system to dispense on other panels continuously.

4. The mass production encapsulation equipment according to claim 1, wherein the dispensing system comprises at least one syringe.

5. The mass production encapsulation equipment according to claim 4, wherein at least one dispensing system further comprises a laser distance measuring apparatus to measure a working distance between at least one syringe and the panel.

6. The mass production encapsulation equipment according to claim 4, wherein at least one dispensing system further comprises a contact-type distance detector to measure a working distance between at least one syringe and the panel.

7. The mass production encapsulation equipment according to claim 4, wherein at least one syringe is controlled by a program to precisely position for various dispensing patterns.

8. The mass production encapsulation equipment according to claim 1, wherein the transporting equipment comprises a conveyance belt or a mechanical arm.

9. A mass production encapsulation equipment for organic light emitting display devices, comprising:
   a cover plate supply system, to supply a cover plate to the mass production encapsulation equipment;
   at least one dispensing system, to coat a resin on the cover plate;
   a turning/storage system, to store the cover plate after it is coated with the resin;
   a panel supply system, to supply a panel to the mass production encapsulation equipment, wherein the cover plate can be optionally coated with the resin;
   a lamination/ultra-violet radiation system, to laminate the panel and the cover plate after they are aligned, and having a first ultra-violet radiation system to perform a first stage exposure;
   a second ultra-violet radiation system, to perform a second stage exposure to cure the resin;
   a transporting system, to transport the cover plate between the cover plate supply system, at least one dispensing system, the turning/storage system, the lamination/ultra-violet radiation system, and the second ultra-violet radiation system, and to transport the panel between the panel supply system, the lamination/ultra-violet radiation system, and the second ultra-violet radiation system; and
   an atmosphere control system, to control moisture level and oxygen level of the mass production encapsulation equipment.

10. The mass production encapsulation equipment according to claim 9, wherein the panel supply system is also used as a product removal system.

11. The mass production encapsulation equipment according to claim 9, wherein the turning/storage system stores at least one cover plate at a time to allow the at least one dispensing system to dispense other cover plates continuously.

12. The mass production encapsulation equipment according to claim 9, wherein the dispensing system comprises at least one syringe.

13. The mass production encapsulation equipment according to claim 12, wherein at least one dispensing system further comprises a laser distance measuring apparatus to measure a working distance between at least one syringe and the panel.

14. The mass production encapsulation equipment according to claim 12, wherein at least one dispensing system further comprises a contact-type distance detector to measure a working distance between at least one syringe and the panel.

15. The mass production encapsulation equipment according to claim 12, wherein the at least one syringe is controlled by a program to precisely position the at lest one syringe for various dispensing patterns.

16. The mass production encapsulation equipment according to claim 9, wherein the transporting equipment comprises a conveyance belt or a mechanical arm.

17. A mass production encapsulation method for organic light emitting display devices, comprising:
   providing a panel supply system to supply at least a panel into a transporting system;
   transporting the panel into a turning/storage system for turning over via the transporting system;
   alternately transporting the panel into a first dispensing system and a second dispensing system for coating a resin on the panel;
   transporting the panel coated with the resin by the first and the second dispensing systems into the turning/storage system for storage;
   transporting the panel into a lamination/ultra-violet radiation system by the transporting system;
   transporting a cover plate into the lamination/ultra-violet radiation system by the transporting system, wherein the cover plate is optionally also coated with the resin;
   performing lamination of the cover plate and the panel and performing a first stage exposure by an ultra-violet light; and
   transporting the panel laminated with the cover plate to an ultra-violet radiation system to perform a second stage exposure.

18. The mass production encapsulation method according to claim 17, wherein the cover plate is selected from a group consisting of glass, plastic, acrylic, polymer and metal.

19. The mass production encapsulation method according to claim 17, wherein the transporting system comprises a conveyance belt or a mechanical arm.

20. The mass production encapsulation method according to claim 17, wherein the step of coating the resin on the panel using the first and second dispensing systems comprises:
   allocating at least one syringe for each in the first and the second dispensing systems; and
   fixing the panel, and moving the at least one syringe along X, Y and Z directions for coating the resin.

21. The mass production encapsulation method according to claim 17, wherein the resin comprises an ultra-violet curing resin or a thermal curing resin.

22. The mass production encapsulation method according to claim 17, wherein the panel and the cover plate are aligned with each other for lamination using a mechanical alignment or a charge-coupled device.

23. The mass production encapsulation method according to claim 17, wherein the step of lamination includes using a mechanical pressure, a gas pressure or a hydraulic pressure.

24. The mass production encapsulation method according to claim 17, wherein the turning/storage system stores at least one panel to allow the first and second dispensing systems to dispense on other panels continuously.

25. A mass production encapsulation method for organic light emitting display devices, comprising:

provinding a cover plate supply system to supply at least a cover plate into a transporting system;

alternately transporting the cover plate into a first dispensing system and a second dispensing system for coating a resin thereon;

transporting the cover plate coated with the resin by the first and the second dispensing systems into a turning/storage system for storage;

transporting the cover plate into a lamination/ultra-violet radiation system by the transporting system;

transporting a panel into the lamination/ultra-violet radiation system by the transporting system;

performing lamination of the cover plate and the panel and performing a first stage exposure by an ultra-violet light; and transporting the panel laminated with the cover plate to an ultra-violet radiation system to perform a second stage exposure.

26. The mass production encapsulation method according to claim 25, wherein the cover plate is selected from a group consisting of glass, plastic, acrylic, polymer and metal.

27. The mass production encapsulation method according to claim 25, wherein the transporting system comprises a conveyance belt or a mechanical arm.

28. The mass production encapsulation method according to claim 25, wherein the step of coating the resin on the cover plate using the first and second dispensing systems comprises:

allocating at least one syringe for each in the first and the second dispensing systems; and fixing the cover plate, and moving the syringes along X, Y and Z directions for coating the resin.

29. The mass production encapsulation method according to claim 25, wherein the resin comprises an ultra-violet curing resin or a thermal curing resin.

30. The mass production encapsulation method according to claim 25, wherein the panel and the cover plate are aligned with each other for lamination using a mechanical alignment or a charge-coupled device.

31. The mass production encapsulation method according to claim 25, wherein the step of lamination includes using a mechanical pressure, a gas pressure or a hydraulic pressure.

* * * * *